United States Patent
White et al.

(10) Patent No.: US 7,534,301 B2
(45) Date of Patent: May 19, 2009

(54) RF GROUNDING OF CATHODE IN PROCESS CHAMBER

(75) Inventors: John M. White, Hayward, CA (US); Robin L. Tiner, Santa Cruz, CA (US); Beom Soo Park, San Jose, CA (US); Wendell T Blonigan, Pleasanton, CA (US)

(73) Assignee: Applied Materials, Inc., Santa Clara, CA (US)

( * ) Notice: Subject to any disclaimer, the term of this patent is extended or adjusted under 35 U.S.C. 154(b) by 374 days.

(21) Appl. No.: 10/946,403

(22) Filed: Sep. 21, 2004

(65) Prior Publication Data
US 2006/0060302 A1 Mar. 23, 2006

(51) Int. Cl.
*C23C 16/00* (2006.01)
*C23F 1/00* (2006.01)
*H01L 21/306* (2006.01)

(52) U.S. Cl. .................. 118/728; 118/729; 118/723 R; 156/345.51

(58) Field of Classification Search ........... 118/715–33, 118/728, 729, 723 R; 156/345.51
See application file for complete search history.

(56) References Cited

U.S. PATENT DOCUMENTS

| | | | |
|---|---|---|---|
| 4,998,178 A | 3/1991 | Weiss | |
| 5,522,937 A | 6/1996 | Chew et al. | |
| 5,964,947 A | 10/1999 | Zhao et al. | |
| 6,024,044 A | 2/2000 | Law et al. | |
| 6,063,441 A | 5/2000 | Koai et al. | |
| 6,162,332 A * | 12/2000 | Chiu ..................... | 204/192.13 |
| 6,183,564 B1 * | 2/2001 | Reynolds et al. ............ | 118/719 |
| 6,221,221 B1 * | 4/2001 | Al-Shaikh et al. ...... | 204/298.02 |
| 6,228,229 B1 | 5/2001 | Raaijmakers et al. | |
| 6,264,812 B1 | 7/2001 | Raaijmakers et al. | |

(Continued)

OTHER PUBLICATIONS

U.S. Appl. No. 10/460,916, Entitled: "RF Current Return Path For A Large Area Substrate Plasma Reactor", filed Jun. 12, 2003, 22 pages.

(Continued)

*Primary Examiner*—Michael Cleveland
*Assistant Examiner*—Keath T Chen
(74) *Attorney, Agent, or Firm*—Patterson & Sheridan LLP

(57) ABSTRACT

An apparatus for providing a short return current path for RF current between a process chamber wall and a substrate support is provided. The RF grounding apparatus, which is RF grounded and is place above the substrate transfer port, establishes electrical contact with the substrate support only during substrate processing, such as deposition, to provide return current path for the RF current. One embodiment of the RF grounding apparatus comprises one or more low impedance flexible curtains, which are electrically connected to the grounded chamber wall, and to one or more low impedance blocks, which make contacts with the substrate support during substrate processing. Another embodiment of the RF grounding apparatus comprises a plurality of low impedance flexible straps, which are electrically connected to the grounded chamber wall, and to one or more low impedance blocks, which make contacts with the substrate support during substrate processing. Yet another embodiment of the RF grounding apparatus comprises a plurality of probes, which either are electrically connected to the grounded chamber wall or are grounded by other means, and actuators accompanying the probes. The actuators move the probes to make electrical contact with the substrate support during substrate processing.

35 Claims, 12 Drawing Sheets

U.S. PATENT DOCUMENTS

| | | |
|---|---|---|
| 6,270,859 B2 | 8/2001 | Zhao et al. |
| 6,297,595 B1 | 10/2001 | Stimson et al. |
| 6,726,805 B2 | 4/2004 | Brown et al. |
| 6,773,562 B1 | 8/2004 | Inagawa et al. |
| 6,830,624 B2 | 12/2004 | Janakiraman et al. |
| 6,933,442 B2 | 8/2005 | Franks, Jr. |
| 7,060,545 B1 | 6/2006 | Husher |
| 7,083,702 B2 | 8/2006 | Blonigan et al. |
| 7,100,532 B2 | 9/2006 | Pribyl |
| 7,112,536 B2 | 9/2006 | Markunas et al. |
| 2001/0035132 A1* | 11/2001 | Kent et al. .............. 118/733 |
| 2005/0056370 A1 | 3/2005 | Brown et al. |
| 2005/0255257 A1 | 11/2005 | Choi et al. |
| 2006/0060138 A1 | 3/2006 | Keller et al. |

OTHER PUBLICATIONS

U.S. Appl. No. 10/919,457, Entitled: "Method And Apparatus For Dechucking A Substrate" filed Aug. 16, 2004, 21 pages.

Taiwan Search Report dated Aug. 8, 2008 for Taiwan Patent Application No. 94125453.

Taiwan Office Action dated Aug. 27, 2008 for Taiwan Patent Application No. 94125453.

Notice of Office Action for China Patent Application No. 200510103695.7 (APPM/9394 CN) dated Dec. 26, 2008.

* cited by examiner

RF GROUNDING OF CATHODE IN PROCESS CHAMBER

FIELD OF THE INVENTION

The embodiments of the present invention generally relate to plasma processing equipment used in the processing of large area substrates, and more particularly relate to an RF current return path for such equipment.

BACKGROUND OF THE INVENTION

Flat panel displays are commonly used for active matrix displays such as computer and television monitors, personal digital assistants (PDAs), cell phones and the like. Liquid crystal displays (LCD), one type of flat panel displays, generally comprise two plates, which could be glass or plastic, having a layer of liquid crystal material sandwiched therebetween. At least one of the plates includes at least one conductive film disposed thereon that is coupled to a power supply. Power supplied to the conductive material film from the power supply changes the orientation of the liquid crystal material, creating patterns such as text or graphics that may be seen on the display. One fabrication process frequently used to produce flat panels is plasma enhanced chemical vapor deposition (PECVD).

Plasma enhanced chemical vapor deposition is generally employed to deposit thin films on a substrate such as those utilized to fabricate flat panels. Plasma enhanced chemical vapor deposition is generally accomplished by introducing a precursor gas into a vacuum chamber that contains the substrate. The precursor gas is typically directed through a distribution plate situated near the top of the chamber. The precursor gas in the chamber is energized (e.g., excited) into a plasma by applying RF power to the chamber from one or more RF sources coupled to the chamber. The excited gas reacts to form a layer of material on a surface of a substrate that is positioned on a temperature controlled substrate support.

During deposition, substrate support needs to be properly RF grounded to ensure no voltage drop across the substrate support to affect deposition uniformity. Ineffective RF grounding allows plasma to travel to the side and below the substrate support to make unwanted deposition in those areas, which makes chamber cleaning more difficult and time-consuming. Some systems employ a low impedance strap to couple the substrate support to the chamber body to facilitate RF grounding of the substrate support.

FIG. 1 (Prior Art) is a simplified perspective, cutaway view of an exemplary conventional processing chamber 100 having a plurality of RF grounding straps 120 for electrically coupling a substrate support 140 to a bottom 134 of the chamber 100. Substrate transfer port 136 is an opening through which the substrate is transferred in and out of the process chamber. Eight straps 120 are shown in FIG. 1, two straps 120 being coupled to each edge of the substrate support 140. The substrate support 140 typically includes a plurality of lift pins 152, some of which are disposed along the edge of the substrate support 140 to lift the edges of the substrate during transfer. Each of the straps 120 includes first and second flexures 122, 124 joined by a bend 126. The straps 120 are generally aligned with the perimeter of the substrate support 140 and spaced to provide room for the lift pins 152 to extend below the substrate support 140. The substrate support 140 could move between a substrate loading position, which is near the lower end 138 of the transport port 136, and a substrate deposition position, which is typically above or near the higher end 139 of the transport port 136. The V-shaped straps 120 bend according to the substrate support position.

While this configuration has proven to be effective and reliable in some applications, it is less effective for systems that require the substrate supports to travel longer distances between the substrate loading positions and the substrate deposition positions. Longer traveling distance requires the RF grounding straps 120 to be longer, which would increase the impedance of the RF grounding straps and lower the RF grounding capability of the straps.

Therefore, there is a need for reliable low-impedance RF groundings that have shorter current return paths.

SUMMARY OF THE INVENTION

Embodiments of the invention generally provide an RF current return path for large area substrate processing. In one embodiment, an apparatus for providing an RF current return path between a process chamber wall and a substrate support enclosed by the process chamber wall comprises a process chamber wall having a substrate transport port, a substrate support enclosed by the process chamber wall and adapted to be moved between a processing position and a non-processing position, and a RF grounding assembly mounted to the process chamber wall and positioned above the substrate transfer port, where the RF grounding assembly contacts the substrate support when the substrate support is in the processing position.

The RF grounding assembly further comprises one or more low impedance blocks that contacts the substrate support during substrate processing, and one or more low impedance flexible curtains or straps, having first ends and second ends, the first ends electrically connected to the process chamber wall and the second ends connected to the one or more low impedance blocks.

In another embodiment, an apparatus for providing an RF current return path between a process chamber wall and a substrate support enclosed by the process chamber wall comprises a process chamber wall having a substrate transport port, a substrate support enclosed by the process chamber wall and adapted to be moved between a processing position and a non-processing position, and a RF grounding assembly mounted to the chamber wall and positioned above the substrate transfer port, where the RF grounding assembly could be actuated to contact the substrate support when the substrate support is in the processing position.

The RF grounding assembly further comprises a plurality of RF grounded probes movable between a position contacting the substrate support when the substrate support is moved to a processing position and a position clear of the substrate support when the substrate support is moved to a non-processing position, and a plurality of actuators that are coupled to the probes and adapted to control the movement of the probes.

BRIEF DESCRIPTION OF THE DRAWINGS

So that the manner in which the above recited embodiments of the invention are attained and can be understood in detail, a more particular description of the invention, briefly summarized above, may be had by reference to the embodiments thereof which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. The drawings in the figures are all schematic and not to scale.

DETAILED DESCRIPTION

The invention generally provides an RF current return path for systems supporting large area substrates. The invention is illustratively described below in reference to a plasma enhanced chemical vapor deposition (PECVD) system, such as those commercially available from AKT, a division of Applied Materials, Inc. of Santa Clara, Calif. However, it should be understood that the invention has utility in other system configurations such as physical vapor deposition systems, etch systems and other processing systems in which a low-impedance RF current return path between a substrate support and a chamber housing the substrate support is desired.

Embodiments of the invention create better ways to uniformly RF ground the susceptor in an RF plasma chamber. Typically, process chambers are not completely symmetrical in terms of structures. For example, one side of the chamber might have a port in the chamber wall for transferring substrates in and out of the process chamber. The chamber walls are part of the RF circuit in a RF plasma chamber. The transfer port (or hole) in one side of the chamber creates an asymmetry in the process chamber. This asymmetry could reduce RF grounding uniformity, which could result in poorer plasma uniformity and degraded process performance.

Figure 1:
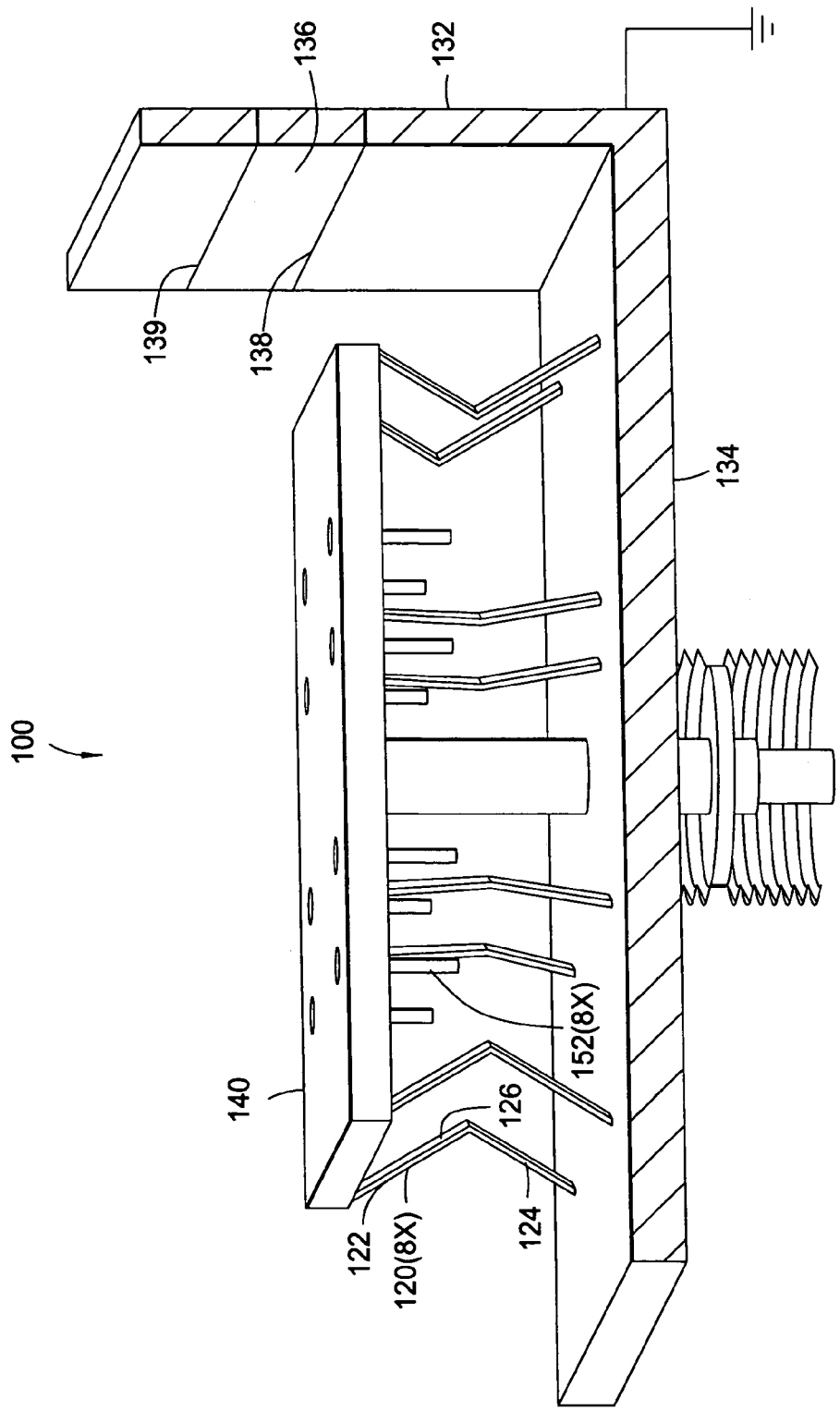
FIG. 1 (Prior Art) is a partial schematic view of a prior art processing system having an RF current return path.

The configuration in FIG. 1 has proven to be effective and reliable in some applications, it is less effective for systems that require the substrate supports to travel longer distances between the substrate loading positions and the substrate deposition positions. Longer traveling distance requires the RF grounding straps to be longer, which would increase the impedance of the RF grounding straps and lower the RF grounding capability of the straps. Impedance, Z, consists of resistance, R, and reactance, X. Equation 1 shows the relationship between impedance, resistance and reactance, wherein "j" in equation 1 is an imaginary number.

$$Z=R+jX \qquad (1)$$

Since both resistance, R, and reactance, X, increase with length of the RF ground straps (see equations 2 and 3), the impedance is higher for longer RF ground strap.

$$R=\rho l/A \qquad (2)$$

ρ is the resistivity of the RE ground strap. Variable "l" in equation (2) is the length of the RE ground strap and A is the cross sectional area of the RE ground strap.

$$X=2\pi fL \qquad (3)$$

f is the frequency (RF in this example) and L is the inductance of the RF ground strap.

For a RF ground strap to work effectively, its impedance must be low. If the impedance is increased, potential difference could exist across the substrate support, which may adversely affect deposition uniformity. In addition, ineffective RF grounding allows plasma to travel to the side and below the substrate support to make unwanted deposition in those areas, which makes cleaning more difficult and more time-consuming. The increased impedance of the RF ground straps as shown in FIG. 1 could render the RF ground strap ineffective in RF grounding for systems used to process larger substrates due to increased lengths of the RF ground straps.

The embodiments of current invention describe apparatuses and methods for improved RF grounding of the susceptor (or substrate support) such that the structural asymmetry in the process chamber does not affect plasma and process uniformities.

Figure 2:
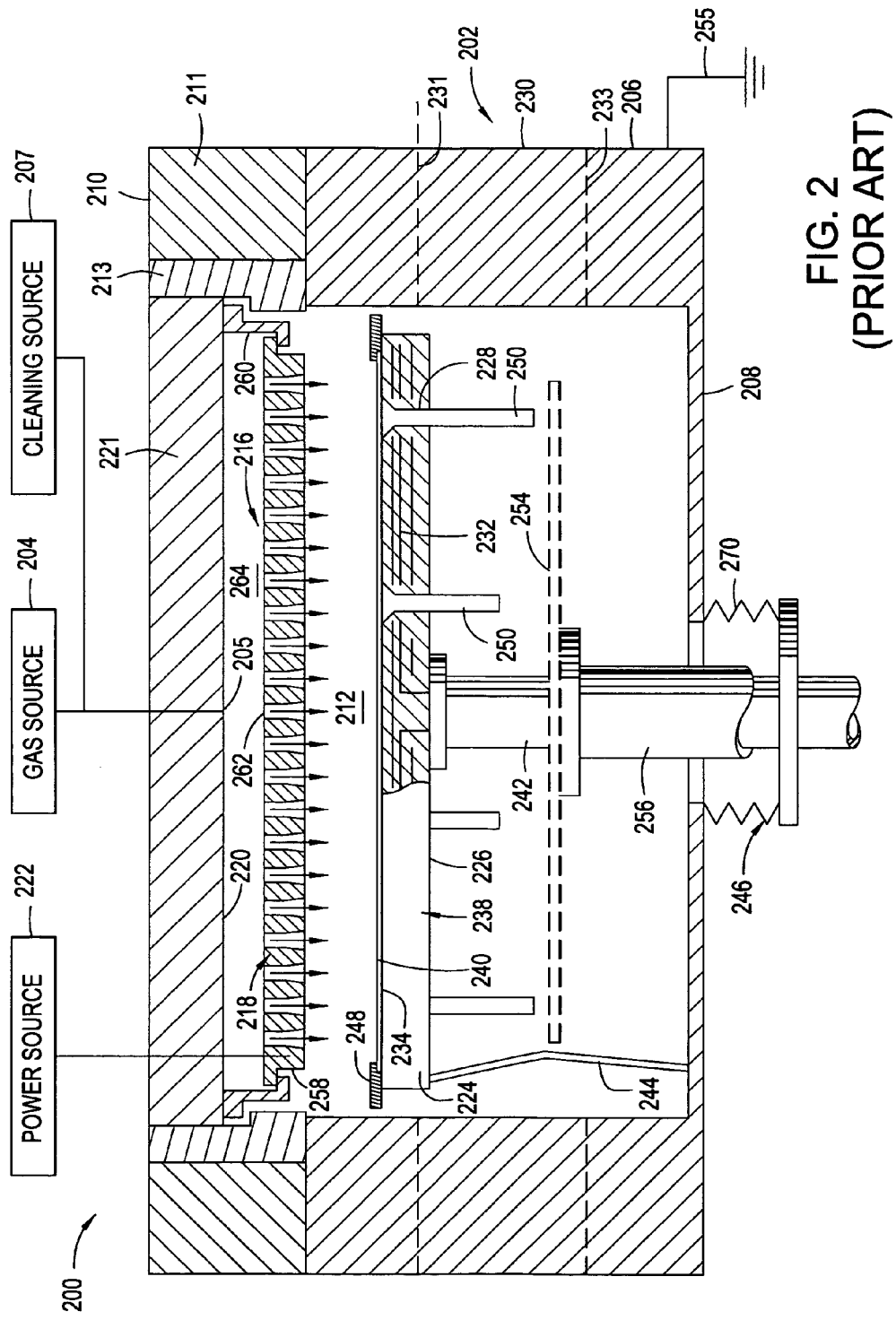
FIG. 2 (Prior Art) is a schematic cross-sectional view of an illustrative processing chamber.

FIG. 2 (Prior Art) is a schematic cross-sectional view of one embodiment of a plasma enhanced chemical vapor deposition system 200, available from AKT, a division of Applied Materials, Inc., Santa Clara, Calif. The system 200 generally includes a processing chamber 202 coupled to a gas source 204. The processing chamber 202 has walls 206 and a bottom 208 that partially define a process volume 212. The process volume 212 is typically accessed through a port 230 in the walls 206 that facilitate movement of a substrate 240 into and out of the processing chamber 202. In FIG. 2, the entry port 230 is between the upper end 231 and the lower end 233. The walls 206 and bottom 208 are typically fabricated from a unitary block of aluminum or other material compatible with processing. The walls 206 support a lid assembly 210.

A temperature controlled substrate support assembly 238 is centrally disposed within the processing chamber 202. The support assembly 238 supports a substrate 240 during processing. In one embodiment, the substrate support assembly 238 comprises a substrate support body 224, which is made of conductive materials, such as aluminum, that encapsulates at least one embedded heater 232. The heater 232, such as a resistive element, disposed in the support assembly 238, controllably heats the support assembly 238 and the substrate 240 positioned thereon to a predetermined temperature. Typically, in a CVD process, the heater 232 maintains the substrate 240 at a uniform temperature between about 150 to at least about 460 degrees Celsius, depending on the deposition processing parameters for the material being deposited.

Generally, the support assembly 238 has a lower side 226 and an upper side 234. The upper side 234 supports the substrate 240. The lower side 226 has a stem 242 coupled thereto. The stem 242 couples the support assembly 238 to a lift system (not shown) that moves the support assembly 238 between an elevated processing position (as shown) and a lowered position that facilitates substrate transfer to and from the processing chamber 202. The stem 242 additionally provides a conduit for electrical and thermocouple leads between the support assembly 238 and other components of the system 200.

A bellows 246 is coupled between support assembly 238 (or the stem 242) and the bottom 208 of the processing chamber 202. The bellows 246 provides a vacuum seal between the chamber volume 212 and the atmosphere outside the processing chamber 202 while facilitating vertical movement of the support assembly 238.

The support assembly 238 generally is connected by RF ground paths 244 that provide low-impedance RF return paths between the support body 224 and ground. The RF ground return paths 244 may be coupled directly or indirectly to ground, for example, through the chamber body 202, and the chamber body is grounded itself through grounding 255. The support assembly 238 is generally RF grounded during processing such that RF power supplied by a power source 222 to a gas distribution plate assembly 218 positioned between the lid assembly 210 and substrate support assembly 238 (or other electrode positioned within or near the lid assembly of the chamber) may excite gases present in the process volume 212 between the support assembly 238 and the distribution plate assembly 218. The RF power from the power source 222 is generally selected commensurate with the size of the substrate to drive the chemical vapor deposition process.

The support assembly 238 additionally supports a circumscribing shadow frame 248. Generally, the shadow frame 248 prevents deposition at the edge of the substrate 240 and support assembly 238 so that the substrate does not stick to the support assembly 238. The support assembly 238 has a plurality of holes 228 disposed therethrough that accept a plurality of lift pins 250. The lift pins 250 are typically comprised of ceramic or anodized aluminum. The lift pins 250 may be actuated relative to the support assembly 238 by an optional lift plate 254 to project from the support surface 234, thereby placing the substrate in a spaced-apart relation to the support assembly 238.

The lid assembly 210 provides an upper boundary to the process volume 212. The lid assembly 210 typically can be removed or opened to service the processing chamber 202. In one embodiment, the lid assembly 210 is fabricated from aluminum (Al). The lid assembly 210 typically includes an entry port 205 through which process gases provided by the gas source 204 are introduced into the processing chamber 202. The entry port 205 is also coupled to a cleaning source 207. The cleaning source 207 typically provides a cleaning agent, such as dissociated fluorine, that is introduced into the processing chamber 202 to remove deposition by-products and films from processing chamber hardware, including the gas distribution plate assembly 218.

The gas distribution plate assembly 218 is coupled to an interior side 220 of the top plate 221 of the lid assembly 210. The top plate 221 and the side wall 211 of the lid assembly 210 are separated by an insulator 213 to prevent arcing. The gas distribution plate assembly 218 is typically configured to substantially follow the profile of the substrate 240, for example, polygonal for large area flat panel substrates and circular for wafers. The gas distribution plate assembly 218 includes a perforated area 216 through which process and other gases supplied from the gas source 204 are delivered to the process volume 212. The perforated area 216 of the gas distribution plate assembly 218 is configured to provide uniform distribution of gases passing through the gas distribution plate assembly 218 into the processing chamber 202.

The gas distribution plate assembly 218 typically includes a diffuser plate (or distribution plate) 258 suspended from a hanger plate 260. The diffuser plate 258 and hanger plate 260 may alternatively comprise a single unitary member. A plurality of gas passages 262 are formed through the diffuser plate 258 to allow a predetermined distribution of gas passing through the gas distribution plate assembly 218 and into the process volume 212. The hanger plate 260 maintains the diffuser plate 258 and the interior surface 220 of the lid assembly 210 in a spaced-apart relation, thus defining a plenum 264 therebetween. The plenum 264 allows gases flowing through the lid assembly 210 to uniformly distribute across the width of the diffuser plate 258 so that gas is provided uniformly above the center perforated area 216 and flows with a uniform distribution through the gas passages 262. The diffuser plate 258 could be circular for semiconductor wafer manufacturing or polygonal, such as rectangular, for flat panel display manufacturing.

Figure 3A:
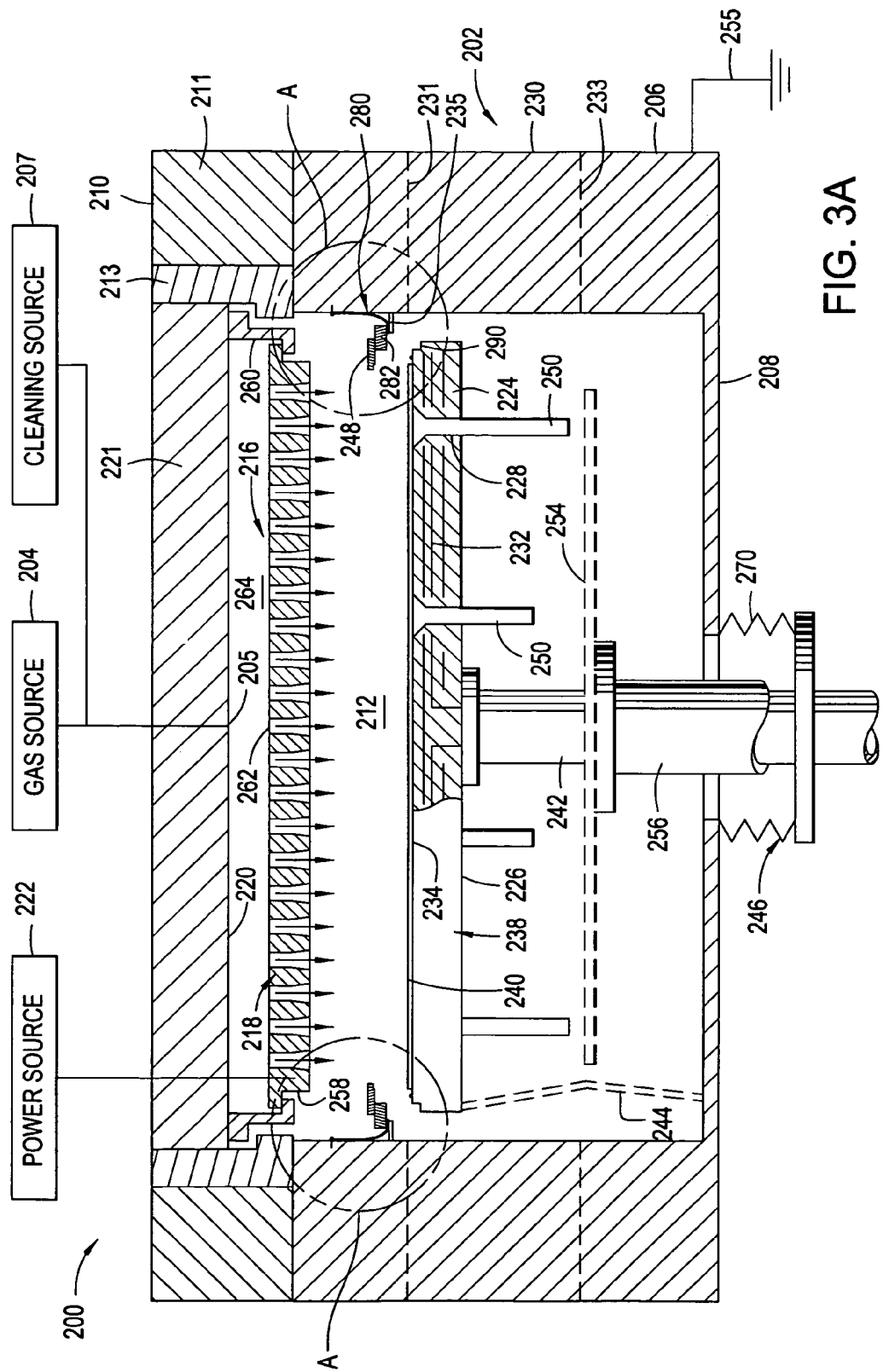
FIG. 3A is a schematic cross-sectional view of one embodiment of a RF grounding assembly of the current invention in the processing chamber of FIG. 2 during non-substrate-processing periods.

FIG. 3A illustrates the relative positions of a substrate support body 224 of the substrate support assembly 238 and an exemplary RF grounding assembly 280 during non-substrate-processing period. The substrate support assembly 238 is at a non-substrate-processing position and is not in contact with the RF grounding assembly 280. The RF grounding assembly 280 sits on one or more grounding rest-pieces 235 and is supported by the rest-pieces 235 during non-substrate processing period. The substrate support body 224 has a substrate 240 on top and has one or more pick-up ledges 290 around the outer perimeter of the top surface of the substrate support body 224. The pick-up ledge(s) 290 will pick up the RF grounding assembly 280 to lift it off the one or more grounding rest-pieces 235 when the substrate support assembly 238 is at the substrate processing position. The RF grounding assembly 280 is placed above the transport port opening 230, is attached to the chamber wall 206, and supports shadow frame 248, which covers the entire edge of the substrate support. In one embodiment, the shadow frame is about 3 inches to about 5 inches wide and about ½ to about 1 inch thick. There is a space between the shadow frame 248 and the diffuser plate 258.

Figure 3B:
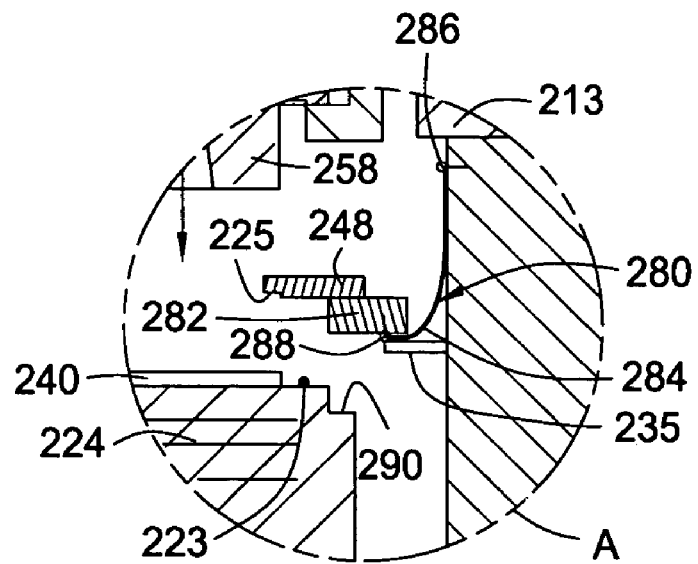
FIG. 3B is an enlarged partial side cross sectional view of circle A of FIG. 3A.

FIG. 3B shows the magnified drawings of elements in circle A of FIG. 3A. The RF grounding assembly 280 is attached to the chamber wall 206 by applicable means, such as welding, soldering, brazing or by an attaching device 286. The RF grounding assembly 280 also consists of one or more low impedance flexible curtains 284, which are attached to the chamber wall 206, and one or more picked-up blocks 282. The one or more flexible curtains 284 are attached to the one or more picked-up blocks 282 by applicable means, such as welding, soldering, brazing or by attaching devices 288.

The low impedance flexible curtains 284 should be made of flexible materials with high conductivity, such as aluminum sheet. The one or more picked-up blocks 282 should be made of low impedance (or high conductivity) blocks, such as aluminum blocks. The one or more picked-up blocks 282 support the shadow frame 248 and are picked up by the pick-up ledge(s) 290 to make contact with the substrate support body 224 during substrate processing, such as deposition, to provide the RF return paths (see FIGS. 3C and 3D below). Each pick-up block 282 is picked up by at least one pick-up ledge.

Figure 3D:
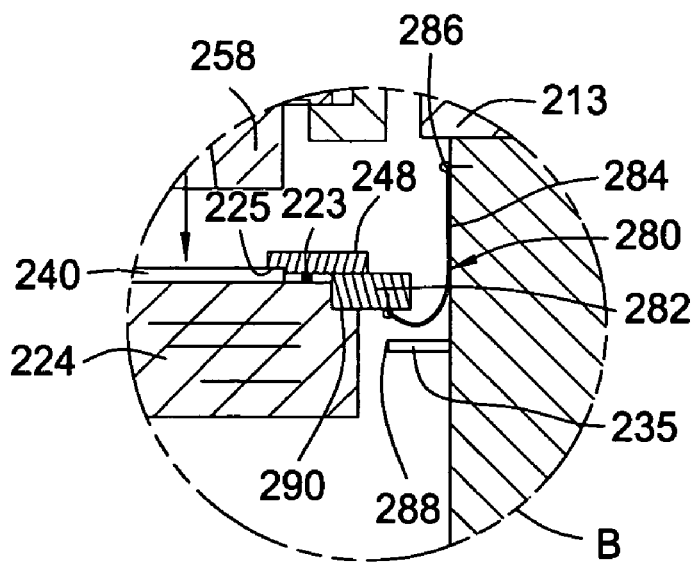
FIG. 3D is an enlarged partial side cross sectional view of circle B of FIG. 3C.
Figure 3C:
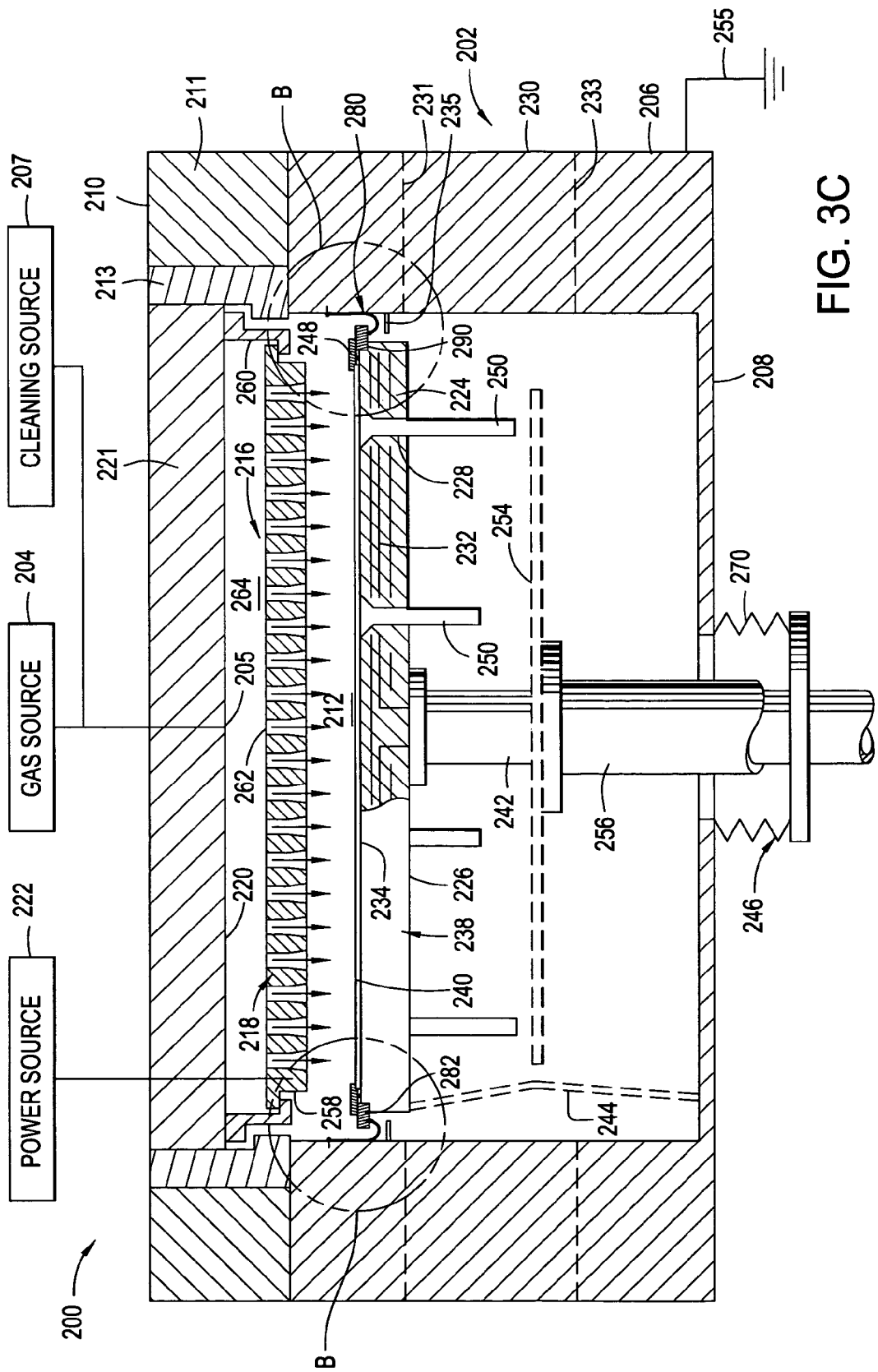
FIG. 3C is a schematic cross-sectional view of one embodiment of a RF grounding assembly of the current invention in the processing chamber of FIG. 2 during substrate processing.

FIG. 3C illustrates the relative positions of a substrate support body 224 of the substrate support assembly 238 and a RF grounding assembly 280 during substrate processing, such as deposition. The substrate support assembly is at substrate processing, such as deposition, position. During processing, the substrate support body 224, which is part of the substrate support assembly 238, is moved up closer to the diffuser plate 258. The pick-up ledge 290 picks up the one or more picked-up blocks 282 to lift the RF grounding assembly 280 off the one or more grounding rest-pieces 235 and makes contact between the substrate support body 224 and the RF grounding assembly 280.

FIG. 3D shows the magnified drawings of elements in circle B of FIG. 3C. The curtain 284 is pushed towards the chamber wall 206 due to the picked-up block 282 being slightly moved up by the pick-up ledge 290. The shadow frame 248, which is typically anodized, partially covers the edge of the substrate 240 at the recess 225 of the shadow frame 248. The shadow frame is supported by the edge of the substrate 240, ceramic buttons 223, which are placed to prevent arching, and picked-up block 282, which are on the substrate support body 224.

The curtain 284 in FIGS. 3A-3D may extend continuously around the entire substrate support body 224 or a portion of the perimeter of the body 224. In one embodiment, a single curtain 284 extends continuously around substantially the full perimeter of the body 224 (e.g., so that the RF grounding assembly 280 may contact the edges of the polygonal body 224 when it's at the substrate processing position) and is connected to one or more picked-up blocks 282. Alternatively, a plurality of curtains 284 may be positioned adjacent to one another to extend around substantially the full perimeter of the body 224, wherein at least one curtain could be coupled to each edge of the polygonal support assembly 238 when it's at the processing position. The plurality of curtains 284 are connected to one or more picked-up blocks 282.

Figure 3E:
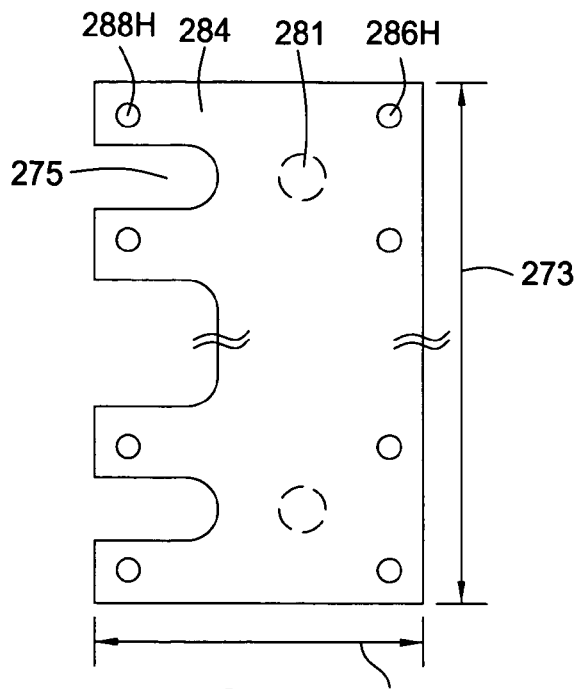
FIG. 3E is a top view of an embodiment of a RF ground curtain.

FIG. 3E shows an exemplary conductive curtain 284 when it is laid flat. The curtain 284 has a width 271 and length 273. The conductive curtain 284 has holes 286H and 288H that allow attaching devices 286 and 288, such as screws, to go through to be attached to the chamber wall protrusion 286 and the picked-up block 282. The conductive curtain has openings 275 that allows reactive species to pass through prior to, during and after processing. The openings 275 can be any shape and at any location on the curtains. The shape shown in FIG. 3E is merely used as an example. The conductive (or low impedance) curtain 284 can optionally have additional holes 281 to assist the passage of reactive species. The additional holes 281 could be any shape. In one embodiment, several curtains 284, each having a width of about 3 inches to about 5 inches and a length of about 5 inches to about 7 inches, are equally spaced around the polygonal body 224 and are connected to the chamber wall 206 and to one or more picked-up blocks 282.

In addition, during processing, temperatures in the chamber 202 can range from 50 to 130 degrees Celsius near the chamber bottom 208, to upwards of 400 degrees Celsius on the surface of the support assembly 238 that is in contact with the substrate 240 during processing. The temperature at chamber wall 206 could be 50 to 350 degrees lower than the substrate support 224. Therefore, the ends of the curtain(s) 284 that are coupled to the picked-up block(s), which are in contact with the substrate support assembly 224, would normally be subject to a much greater degree of thermal expansion than the ends of the curtain(s) 284 that are coupled to the chamber wall 206. Such variations in expansion could cause the curtain(s) 284 to deform, impacting the functionality and the useful life of the curtain(s) 284 in undesirable ways. To counteract the thermal differentials, at least one perforation (or opening) 275 is formed in the curtain(s) 284 proximate the ends that coupled to the picked-up blocks to allow for thermal expansion of the curtain(s) 284. In one embodiment, a plurality of perforations 275, each having a width of about 0.5 inch to about 1 inch, are spaced about every 2 inches to about every 4 inches along the end of the curtain(s) 284 that are coupled to the picked-up blocks.

The curtain 284 is comprised of a flexible, low impedance conductive metal that is resistant to processing and cleaning chemistries. In one embodiment, the curtain 284 is comprised of aluminum sheet and is about 0.008 inch to about 0.016 inch thick. Alternatively, the curtain 284 may comprise titanium, stainless steel, or a flexible material that is coated with a conductive metallic coating.

Current passes from the plasma to the substrate 240, which is in electrical contact with the conductive body 224 of the support assembly 238. The current passes from body 224 through the RF ground curtain 284 and chamber wall protrusion 213 to the chamber walls 206 and chamber bottom 208, which are grounded through grounding 255. The curtain 284 significantly shortens the return path for RF current to ground during processing as compared to conventional RF grounding techniques. The conventional RF grounding strap between the bottom of the substrate support 224 and the chamber bottom 208 could be about 20 inches or longer, while the distance of the RF grounding curtain 284 between the picked-up block and the chamber wall 206 could be about 3 inches to about 5 inches or shorter.

Furthermore, the curtain 284 provides a larger current carrying area, which makes it ideally suitable for use in large area processing applications. The shorter distance and large current carrying capacity of the curtain 284 results in a much lower voltage differential across the surface of the support assembly 238 and the grounded chamber 202, thereby substantially reducing the likelihood of non-uniform plasma deposition and unwanted deposition at the areas to the side and below the substrate support 224.

The one or more picked-up blocks 282 support the shadow frame 248. Each picked-up block 282 may extend continuously around the entire substrate support body 224 or a portion of the perimeter of the body 224. In one embodiment, a single picked-up block 282 extends continuously around substantially the full perimeter of the body 224 (e.g., so that the picked-up block 282 may contact the edges of the polygonal body 224 when it's at the processing position). Alternatively, a plurality of blocks 282 may be positioned adjacent to one another to extend around substantially the full perimeter of the body 224, wherein at least one block could contact each edge of the polygonal support assembly 238 when the support assembly is at the substrate processing, such as deposition, position.

The block 282 is comprised of a flexible, low impedance conductive metal that is resistant to processing and cleaning chemistries. In one embodiment, the block 282 is comprised of aluminum and has a cross-section of about ¼ inch to about ¾ inch by about ¼ to about ¾ inch. Alternatively, the block 282 may comprise titanium, stainless steel, or a flexible material that is coated with a conductive metallic coating.

Figure 3F:
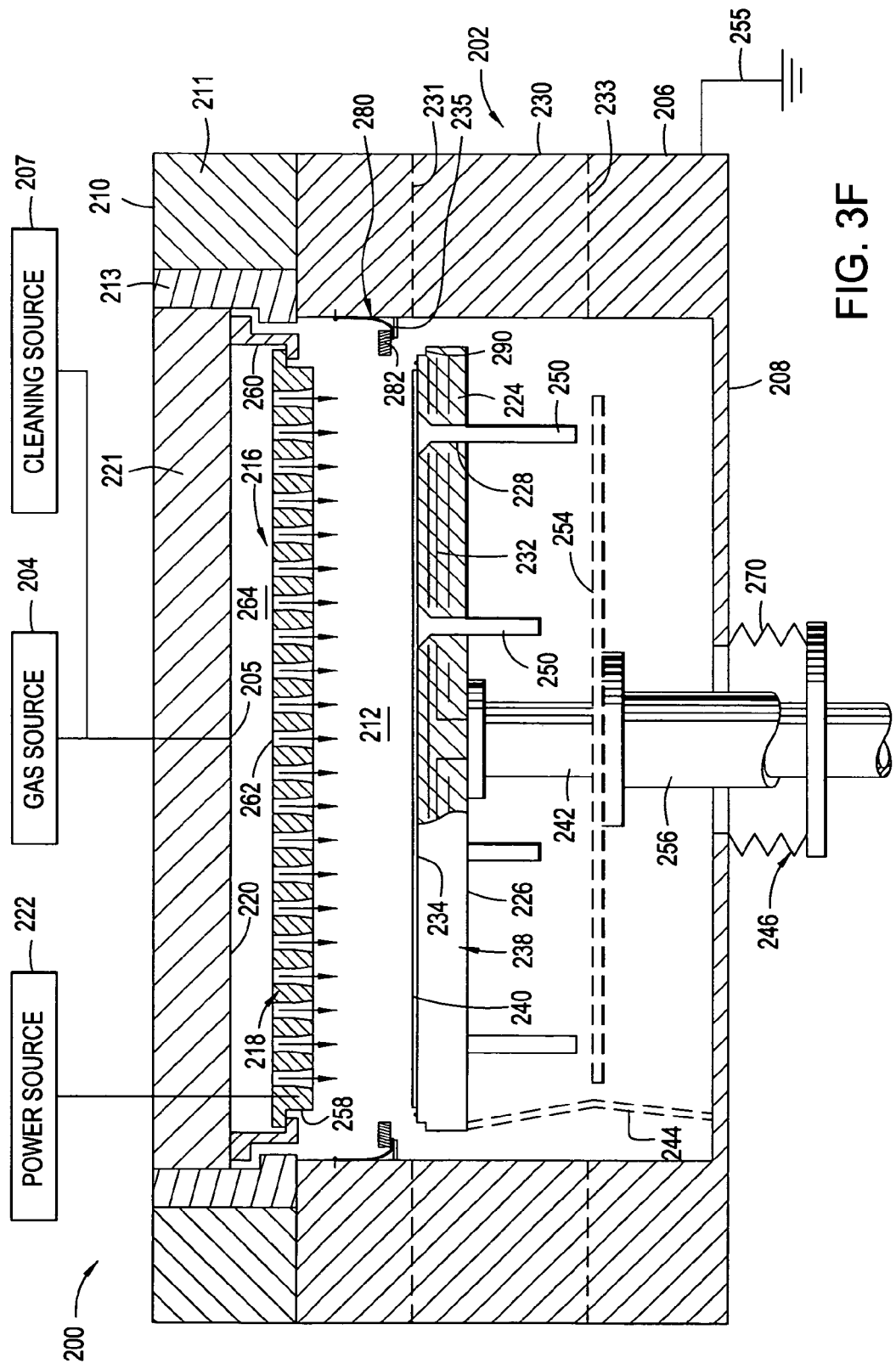
FIG. 3F is a schematic cross-sectional view of one embodiment of a RF grounding assembly of the current invention in the process chamber of FIG. 2.

Shadow frames 248 are needed in some deposition chambers, since they prevents deposition at the edge of the substrate 240 and substrate support body 224 so that the substrate 240 does not stick to the substrate support body 224. In some process chambers the shadow frames are not needed. In a process chamber without a shadow frame, the RF grounding assembly 280 can stand alone without the shadow frame 248. FIG. 3F shows the embodiment in FIG. 3A without the shadow frame.

The pick-up ledge 290 picks up the one or more picked-up blocks 282 when substrate support 224 moves up to reach the substrate processing, such as deposition, position. During substrate processing, the surface of the pick-up ledge 290 is in contact with the picked-up block to provide electrical connection. The pick-up ledge 290 could be one continuous ledge around the full perimeter of the substrate support or it could be divided into several ledges separated by perimeter areas without ledges. The width of the ledge is at least 0.01 inch, and preferably at least 0.1 inch, to fulfill the function of picking up the picked-up blocks 282. The height of the pick-up ledge 290 must be designed to accommodate the height of the picked-up block 282 and the thickness of the substrate 240 to allow the top surface of the picked-up blocks 282 to be at the same level as the surface of the substrate 240. The pick-up ledge 290 could be around the whole substrate support 224 or only around part of the substrate support body 224, depending on the design of the picked-up block 282 of the RF grounding assembly 280.

Figure 4E:
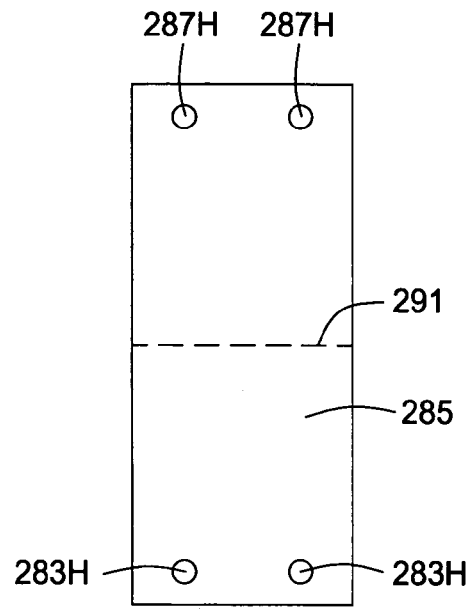
FIG. 4E is a top view of an embodiment of a RF ground strap.
Figure 4F:
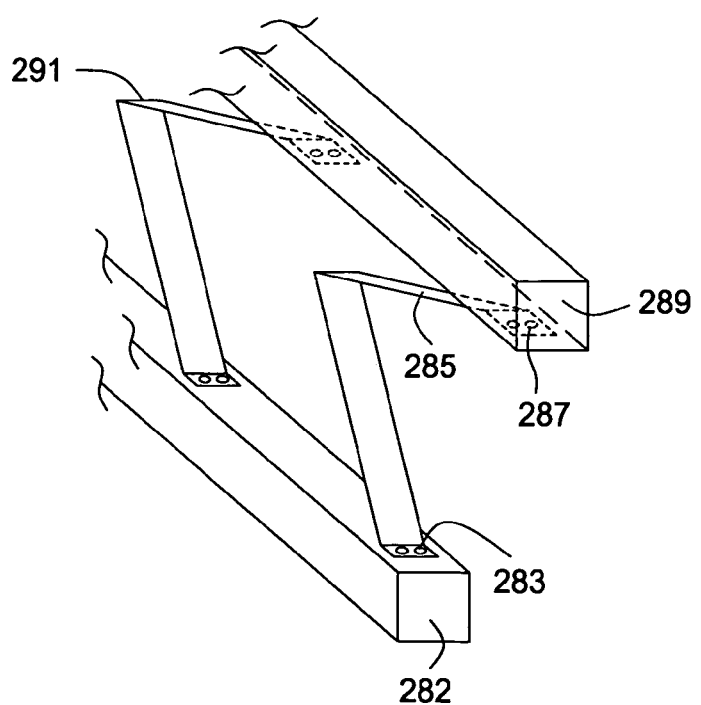
FIG. 4F is a schematic side view of two RF ground straps coupled to a picked-up block and an attachment block.
Figure 4A:
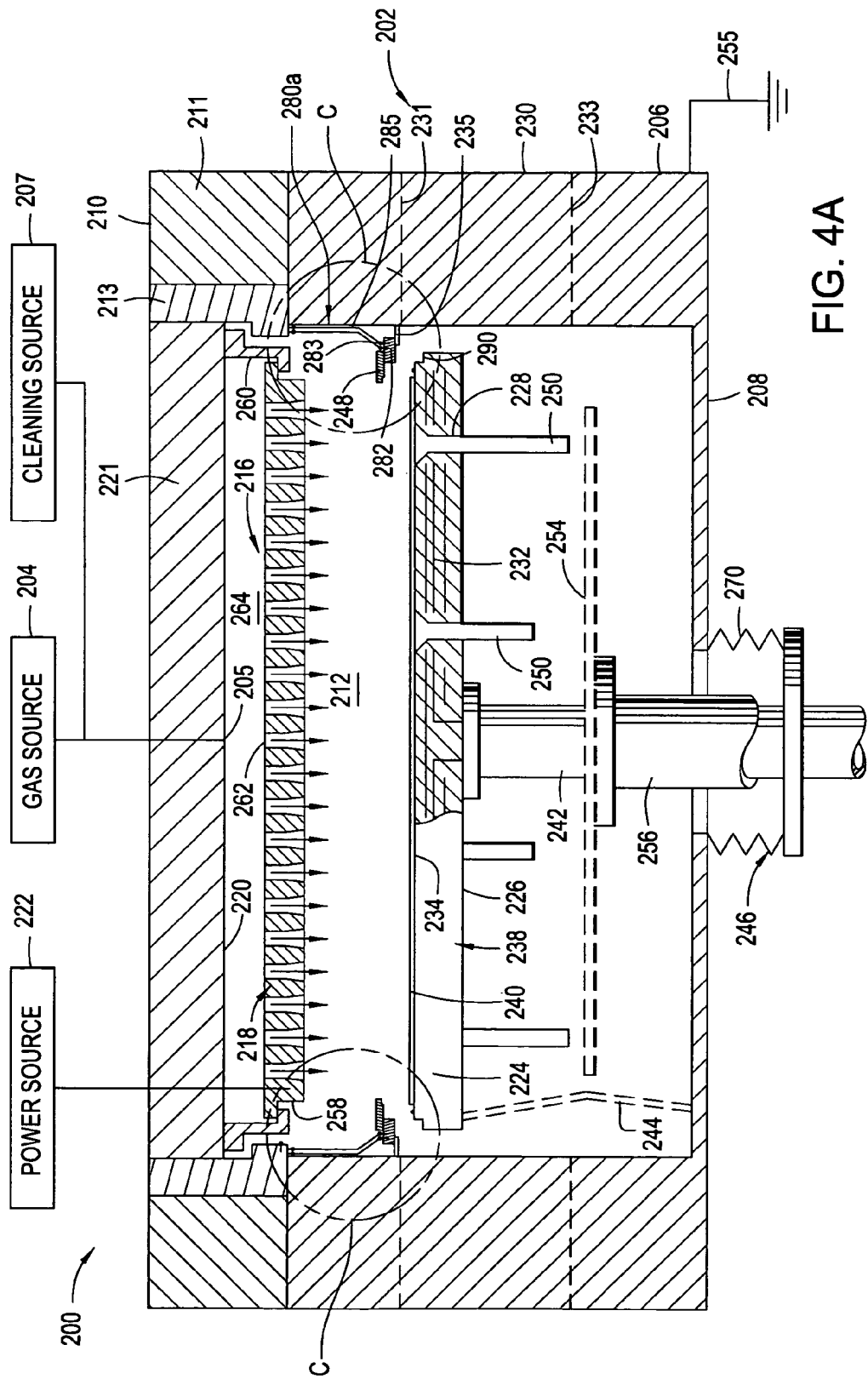
FIG. 4A is a schematic cross-sectional view of another embodiment of a RF grounding assembly of the current invention in the processing chamber of FIG. 2 during non-substrate-processing periods.

FIG. 4A illustrates the relative positions of a substrate support body 224 of the substrate support assembly 238 and another exemplary RF assembly 280a during non-substrate-processing period. The substrate support body 224 is at non-substrate-processing position and is apart from the RF grounding assembly 280a. The RF grounding assembly 280a sits on one or more grounding rest-pieces 235 and is supported by the rest-pieces 235 during non-processing period. The substrate support body 224 has a substrate 240 on top and has a pick-up ledge 290 around the outer perimeter of the top surface of the substrate support body 224. The pick-up ledge 290 will pick up the RF grounding assembly 280a to lift it off the grounding rest-pieces 235 when the substrate support assembly 238 is moved to the substrate processing, such as deposition, position. The RF grounding assembly 280a is placed above the transport port opening 230, and supports shadow frame 248. The RF grounding assembly 280a could include one or more attachment blocks 289 that allow it to be coupled to the chamber wall 206. The RF grounding assembly 280a could also be directly coupled to the chamber wall 206 without the attachment blocks 289. There is a space between the shadow frame 248 and the diffuser plate 258.

Figure 4B:
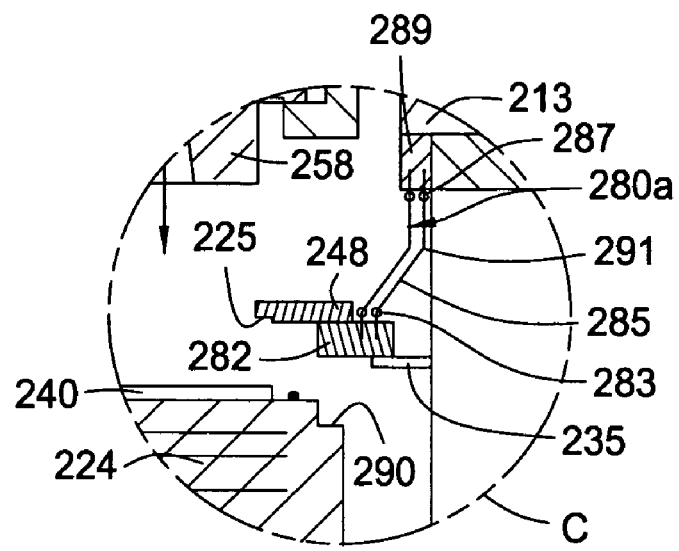
FIG. 4B is an enlarged partial side cross sectional view of circle C of FIG. 4A.

FIG. 4B shows the magnified drawings of elements in circle C of FIG. 4A. The RF grounding assembly 280a is attached to the one or more attachment blocks 289 on the chamber wall 206 by applicable means, such as welding, soldering, brazing or by an attaching device 287. The RF grounding assembly 280a also consists of a plurality of low impedance flexible straps 285, which are attached to the attachment blocks 289, and one or more picked-up block 282. The straps 285 are attached to the one ore more picked-up blocks 282 by applicable means, such as welding, soldering, brazing or by attaching devices 283.

The low impedance straps 285 should be made of flexible materials with high conductivity, such as aluminum strip. In one embodiment, each strap 285 contains at least one bend 291 that allows the bent V-shaped strap to be compressed or relaxed to allow the picked-up block 282 to be moved up at substrate processing, such as deposition, position and to be moved down at non-substrate-processing position(s). The bend 291 could be rounded to improve bend reliability and to reduce the occurrence of metal breakage. The one or more picked-up blocks 282 should be made of low impedance (or high conductivity) blocks, such as aluminum blocks. The blocks 282 may comprise titanium, stainless steel, or a solid material that is coated with a conductive metallic coating. The one or more picked-up blocks 282 support the shadow frame 248 and are picked up by the pick-up ledge 290 to make contact with the substrate support body 224 during substrate processing to provide the RF return paths (see FIGS. 4C and 4D below).

Figure 4D:
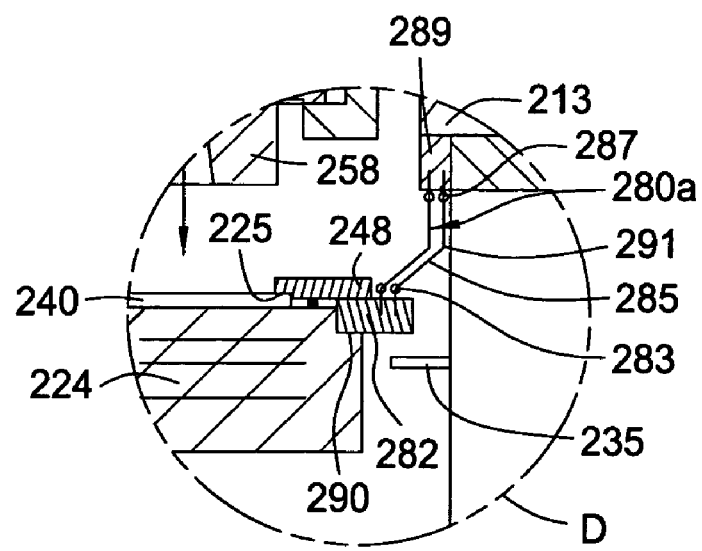
FIG. 4D is an enlarged partial side cross sectional view of circle D of FIG. 4C.
Figure 4C:
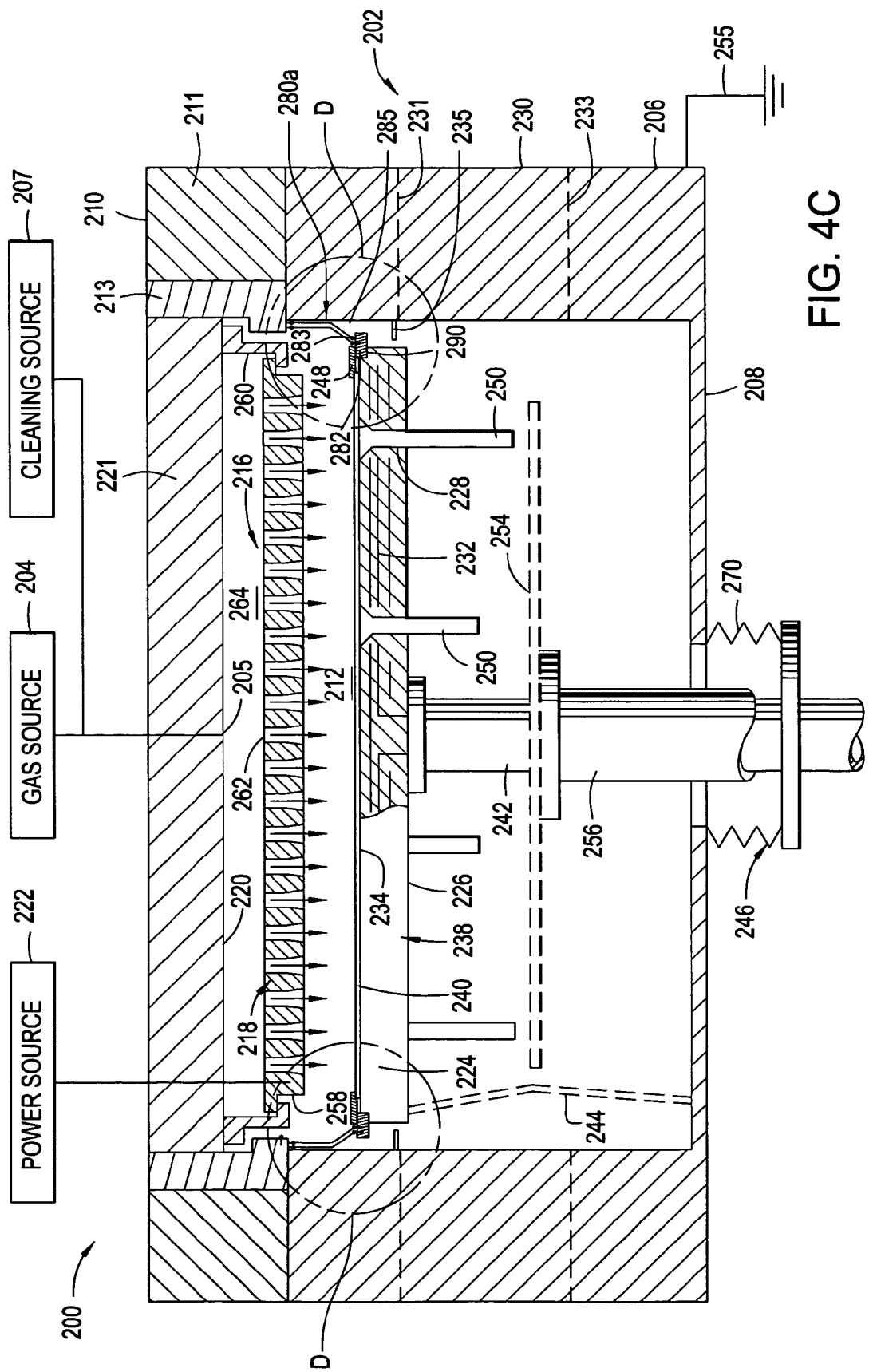
FIG. 4C is a schematic cross-sectional view of another embodiment of a RF grounding assembly of the current invention in the processing chamber of FIG. 2 during substrate processing.

FIG. 4C illustrates the relative positions of a substrate support body 224 of the substrate support assembly 238 and the RF grounding assembly 280a of FIG. 4A during substrate processing. The substrate support body 224 is at substrate process, such as deposition, position. The substrate support body 224 and the RF grounding assembly 280a are in contact through the contact between the picked-up block 282 and the substrate support body 224. During processing, the substrate support body 224, which is part of the substrate support assembly 238, is moved up closer to the diffuser plate 258. The pick-up ledge 290 picks up the picked-up block 282 and makes contact between the substrate support body 224 and the RF grounding assembly 280a. FIG. 4D shows the magnified drawings of elements in circle D of FIG. 4C.

The plurality of straps 285 may be positioned adjacent to one another to extend around substantially the full perimeter of the body 224, wherein at least one curtain is coupled to each edge of the polygonal support assembly 238 when the substrate support 240 is at substrate processing position. The plurality of straps 285 are connected to one or more picked-up blocks 282. In one embodiment, several straps 285, each having a width 271 of about ¼ inch to about ¾ inch and length 273 about 4 inches to about 6 inches at about 0.008 inch to about 0.016 inch thick, are positioned one on each edge of a polygonal body 224. In one embodiment, the bends 291 are roughly at the middle of the straps 285. The straps 285 are made of flexible, low impedance conductive metals that are resistant to processing and cleaning chemistries. In one embodiment, the straps 285 are made of aluminum. Alternatively, the straps 285 may comprise titanium, stainless steel, or a flexible material that is coated with a conductive metallic coating.

FIG. 4E shows an embodiment of a conductive strap 285 when it is laid flat. The conductive strap 285 has holes 287H and 283H that allow attaching devices 287 and 283, such as screws, to go through to be attached to the attachment blocks 289 and the picked-up blocks 282. In one embodiment, the strap 285 contains at least one bend 291, positioned between the end that is attached to the attachment block 289 and the end that is attached to the picked-up block 282. The strap, 285 with one bend 291, is V-shaped viewing from the side. The bend(s) 291 are oriented substantially parallel to the edges of the attachment blocks 289 and the picked-up blocks. The bend(s) 291 is pre-formed in the strap 285 to increase the useful life of the strap 285; repeated stress transmitted into the strap 285 by vertical movement of the support assembly 238 might otherwise cause the bends 291 to crack, necessitating replacement of the straps 285.

FIG. 4F shows multiple straps 285 that are positioned adjacent to one another and are attached to the attachment block 289 and the picked-up block 282. The space between the conductive straps 285 allows the reactive species to pass through.

The straps 285 significantly shorten the return path for RF current to ground during processing as compared to conventional RF grounding techniques. The conventional RF grounding straps between the bottom of the substrate support 224 and the chamber bottom 208 could be 20 inches or longer, while the distance of the RF grounding strap 285 between the picked-up block 282 and the attaching block 289 could be about 4 inches to about 6 inches or shorter. Current passes from the plasma to the substrate 240, which is in electrical contact with the conductive body 224 of the support assembly 238. The current passes from body 224 through the RF ground strap 285 and attachment block 289 to the chamber walls 206, which is grounded through grounding 255.

Furthermore, the straps 285 could provide large current carrying capacity, which makes them ideally suitable for use in large area processing applications. The shorter distance (low impedance) and large current carrying capacity of the straps 285 result in a much lower voltage differential between the surface of the support assembly 238 and the grounded chamber 202, thereby substantially reducing the likelihood of non-uniform plasma deposition and unwanted deposition at the areas to the side and below the substrate support 224.

The designs of the picked-up blocks 282 and the pick-up ledges 290 in FIGS. 4A-4F are similar to those described in the RF grounding assembly 280 in FIGS. 3A-3E. In addition, similar to the RF grounding assembly design described in FIGS. 3A-3E, for process chamber without shadow frame, the RF grounding assembly 280a described in FIGS. 4A-4F can stand alone without the shadow frame 258.

RF grounding curtains 284 shown in FIGS. 3A-3F and RF grounding straps 285 shown in FIGS. 4A-4F endure less bending than the conventional RF grounding straps shown in FIG. 1.

Figure 5:
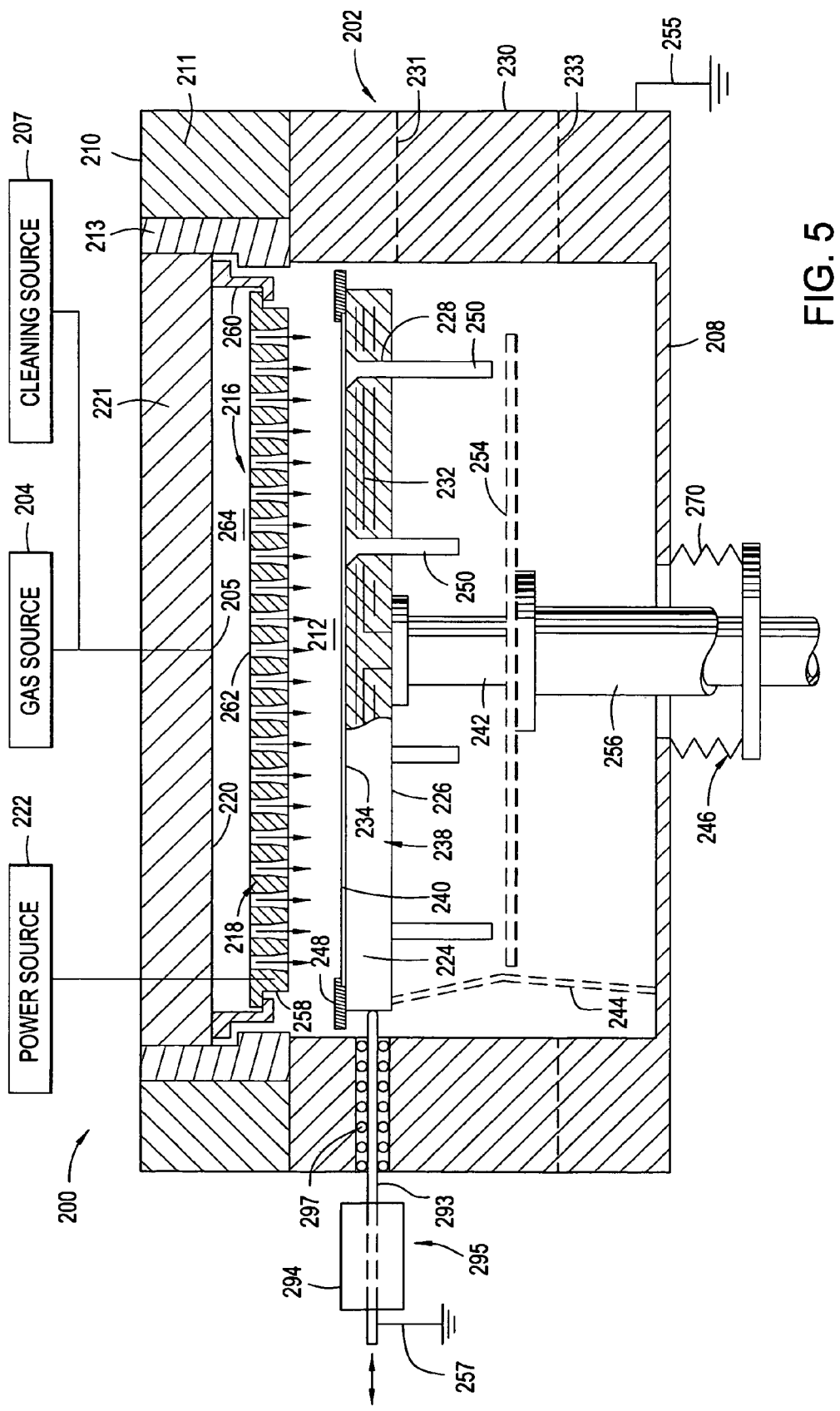
FIG. 5 is a schematic cross-sectional view of another embodiment of a RF grounding assembly of the current invention in the processing chamber of FIG. 2 during substrate processing.
Figure 6:
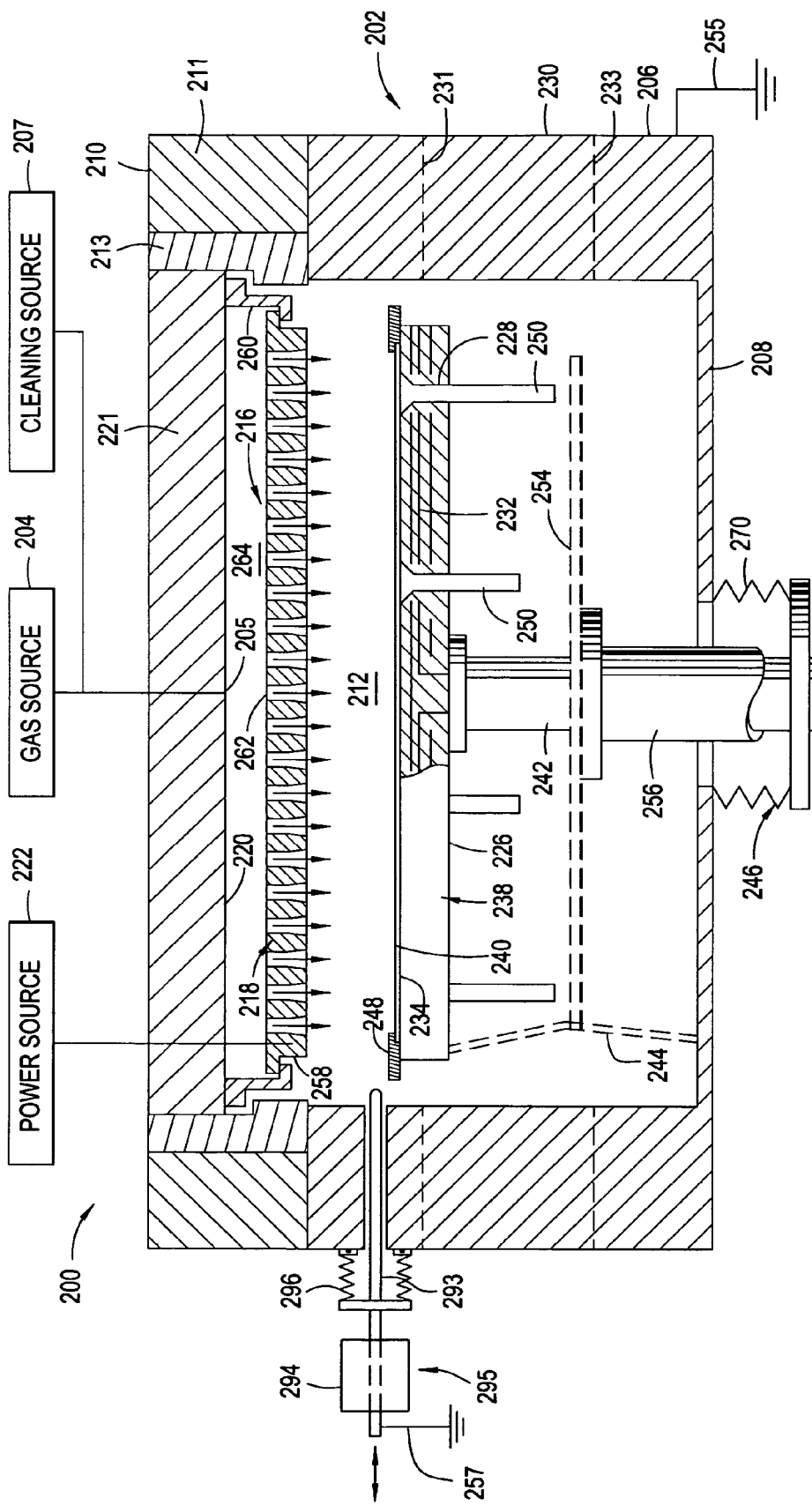
FIG. 6 is a schematic cross-sectional view of another embodiment of a RF grounding assembly of the current invention in the processing chamber of FIG. 2 during non-substrate-processing periods.

FIG. 5 depicts is a cross sectional view of another embodiment of the invention. The substrate support body 224, of the substrate support assembly 238, is RF grounded by one or more RF grounding assemblies 295, which contain RF ground probes 293. The RF ground probe 293 is moveable between a position contacting the substrate support body 224 during substrate processing, such as deposition, as shown in FIG. 5, and a position clear of the substrate support body 224 during non-substrate-processing periods (see FIG. 6). The RF ground probe 293 is inserted through the chamber wall 206 with vacuum sealing device, such as vacuum seal with bearings 297 in FIG. 5, or sealing bellows 296 in FIG. 6. Vacuum seal with bearings 297 in FIG. 5 and sealing bellows 296 in FIG. 6 could be conductive and could RF ground the probes 293 to the chamber wall 206. If the vacuum seal with bearings 297 in FIG. 5 and sealing bellows 296 in FIG. 6 are not conductive, the probes 293 could be RF grounded through grounding 257. The RF ground probes 293 are placed above the substrate transfer port 230 to allow them to contact the substrate support 224 during substrate processing and not be affected by the substrate transport. An actuator 294 interacts with the RF ground probe 293 to control the displacement of the RF ground probe 293. The actuator 294 may be a solenoid linear actuator, pneumatic or hydraulic cylinder or other device suitable to move the RF ground probe 293 into and out of contact with the substrate support body 224. The actuator 294 could be connected to a controller (not shown here) to move the probes 293 into contact with the substrate support 240 during substrate processing.

A plurality of probes 293 may be positioned adjacent to one another to extend around substantially the full perimeter of the body 224, wherein at least one probe would contact each edge of the polygonal support assembly 238 when the substrate support 240 is at substrate processing position. Preferably, there is one probe at least about every 4 inches to about every 8 inches along the edge of the polygonal substrate support 240. In one embodiment, the diameters of the probes are about $\frac{3}{8}$ inch to about $\frac{1}{2}$ inch.

The probes 293 are made of low impedance conductive metals that are resistant to processing and cleaning chemistries. In one embodiment, the probes 293 are made of aluminum. Alternatively, the probes 293 may comprise titanium, stainless steel, or a material that is coated with a conductive metallic coating.

The probes 293 significantly shorten the return path for RF current to ground during processing as compared to conventional RF grounding techniques. The conventional RF grounding straps between the bottom of the substrate support 224 and the chamber bottom 208 could be 20 inches or longer, while the length of the RF grounding probe 293, that contacts the substrate support 224, between the substrate support 224 and the grounded chamber wall 206 could be about 2 inches to about 3 inches or shorter. Preferably the length of the RF grounding probe 293, that contacts the substrate support 224, between the substrate support 224 and the grounded chamber wall 206 is 10 inches or shorter. Current passes from the plasma to the substrate 240, which is in electrical contact with the conductive body 224 of the support assembly 238. The current passes from body 224 through the RF grounding probes 293 to the chamber walls 206, which is grounded through grounding 255.

Furthermore, the probes 293 could provide large current carrying capacity, which makes them ideally suitable for use in large area processing applications. The shorter distance (low impedance) and large current carrying capacity of the curtain 284 results in a much lower voltage differential between the surface of the support assembly 238 and the grounded chamber 202, thereby substantially reducing the likelihood of non-uniform plasma deposition and unwanted deposition at the areas to the side and below the substrate support 224.

Thus, the embodiments of the present invention represent a significant advancement in the field of large area substrate processing due to the shorter RF return paths. The embodiments of the invention could be applied to any plasma processing systems. The embodiments of the invention provide an apparatus that significantly limits voltage drops in an RF current return path and is suitable for use in large scale processing systems such as those used to fabricate flat panel and liquid crystal displays. The embodiments of the present invention have advantages over conventional RF grounding techniques when the substrate support needs to travel a long distance. The embodiments of the present invention work equally well as the conventional RF grounding techniques for plasma processing systems whose substrate supports do not need to travel a long distance.

While the foregoing is directed to embodiments of the invention, other and further embodiments of the invention may be devised without departing from the basic scope thereof, and the scope thereof is determined by the claims that follow.

What is claimed is:

1. An apparatus for providing an RF current return path between a process chamber wall and a substrate support enclosed by the process chamber wall, comprising:
   a substrate support movable between a first position and a second position; and
   a RF return assembly comprising:

one or more elements movable from a third position spaced apart from the substrate support when the substrate support is at a lower position and a fourth position in contact with the substrate support when the substrate support is in an elevated position; and
a plurality of flexible straps having first ends and second ends and at least one bend between the first and second ends, wherein the first ends are adapted to be attached to and electrically connected to the process chamber wall and the second ends are in contact with and electrically connected to the one or more elements.

2. The apparatus of claim 1, wherein the flexible straps are made of material selected from the group consisting of aluminum, titanium, stainless steel, a flexible material that is coated with a conductive metallic coating, and combinations thereof.

3. The apparatus of claim 1, wherein the flexible straps are made of aluminum and are about 0.008 inch to about 0.016 inch thick.

4. The apparatus of claim 1, wherein each flexible strap is about ¼ inch to about ¾ inch wide and about 4 inches to about 6 inches long.

5. The apparatus of claim 1, wherein the substrate support is polygonal and there is at least one flexible strap at each edge of the polygonal substrate support.

6. The apparatus of claim 1, wherein reactive species can pass through between the flexible straps.

7. The apparatus of claim 1, further comprising: one or more attachment blocks coupled between each flexible strap and the process chamber wall.

8. The apparatus of claim 7, wherein the one or more attachment blocks are made of material selected from the group consisting of aluminum, titanium, stainless steel, a solid material that is coated with a conductive metallic coating, and combinations thereof.

9. The apparatus of claim 7, wherein the first end of each flexible strap is coupled to the one or more attachment blocks by welding, soldering, brazing or by an attaching device.

10. The apparatus of claim 1, wherein the second end of each flexible strap is coupled to the one or more elements by welding, soldering, brazing or by an attaching device.

11. The apparatus of claim 1, wherein the one or more elements comprise a shadow frame.

12. The apparatus of claim 1, wherein the one or more elements are supported by one or more rest-pieces when in the third position.

13. The apparatus of claim 1, wherein the substrate support is polygonal and a plurality of the elements are positioned adjacent to one another to extend around substantially the full perimeter of the substrate support and at least one element contacts each edge of the polygonal substrate support.

14. The apparatus of claim 1, wherein the one or more elements are made of material selected from the group consisting of aluminum, titanium, stainless steel, a solid material that is coated with a conductive metallic coating, and combinations thereof.

15. The apparatus of claim 1, wherein the cross-sections of the one or more elements are about ¼ inch to about ¾ inch.

16. The apparatus of claim 1, wherein the apparatus is a plasma enhanced chemical vapor deposition apparatus, the apparatus further comprising a gas distribution showerhead and an RF power source coupled to the gas distribution showerhead.

17. The apparatus of claim 16, wherein the one or more elements and the plurality of flexible straps are disposed between the gas distribution showerhead and the substrate support.

18. A plasma enhanced chemical vapor deposition apparatus for providing an RF current return path between a process chamber wall and a substrate support enclosed by the process chamber wall, comprising:
a gas distribution showerhead;
a process chamber wall having a substrate transport port;
a substrate support enclosed by the process chamber wall and movable between a first position and a second position; and
a RF return assembly mounted to the process chamber wall, positioned above the substrate transport port, wherein the RF return assembly further comprises:
one or more elements movable between a third position spaced apart from the substrate support when the substrate support is at a lower position and a fourth position in contact with the substrate support when the substrate support is in an elevated position; and
a plurality of flexible straps having first ends and second ends and at least one bend between the first and second ends, wherein the first ends are attached to and electrically connected to the process chamber wall and the second ends are in contact with and electrically connected to the one or more elements.

19. A plasma enhanced chemical vapor deposition apparatus for providing an RF current return path between a process chamber wall and a substrate support enclosed by the process chamber wall, comprising:
a gas distribution showerhead;
a process chamber wall having a substrate transport port;
a substrate support enclosed by the process chamber wall and movable between a first lower position and a second elevated position; and
a RF return assembly mounted to the process chamber wall, positioned above the substrate transport port, wherein the RF return assembly comprises:
one or more elements disposed above the substrate support in a third position spaced apart from the substrate support and between the first position and second position, the one or more elements movable to a fourth position above the third position in contact with the substrate support when the one or more elements contact the substrate support; and
a plurality of flexible straps having first ends and second ends and at least one bend between the first and second ends, wherein the first ends are attached to and electrically connected to the process chamber wall and the second ends are in contact with and electrically connected to the one or more elements.

20. The apparatus of claim 19, wherein the flexible straps are made of material selected from the group consisting of aluminum, titanium, stainless steel, a flexible material that is coated with a conductive metallic coating, and combinations thereof.

21. The apparatus of claim 19, wherein the flexible straps are made of aluminum and are about 0.008 inch to about 0.016 inch thick.

22. The apparatus of claim 19, wherein each flexible strap is about ¼ inch to about ¾ inch wide and about 4 inches to about 6 inches long.

23. The apparatus of claim 19, wherein the substrate support is polygonal and there is at least one flexible strap at each edge of the polygonal substrate support.

24. The apparatus of claim 19, wherein reactive species can pass through between the flexible straps.

25. The apparatus of claim 19, further comprising:
one or more attachment blocks coupled between each flexible strap and the process chamber wall.

26. The apparatus of claim 25, wherein the one or more attachment blocks are made of material selected from the group consisting of aluminum, titanium, stainless steel, a solid material that is coated with a conductive metallic coating, and combinations thereof.

27. The apparatus of claim 25, wherein the first end of each flexible strap is coupled to the one or more attachment blocks by welding, soldering, brazing or by an attaching device.

28. The apparatus of claim 19, wherein the second end of each flexible strap is coupled to the one or more elements by welding, soldering, brazing or by an attaching device.

29. The apparatus of claim 19, wherein the one or more elements comprises a shadow frame.

30. The apparatus of claim 19, wherein the one or more elements are supported by one or more rest-pieces when in the third position.

31. The apparatus of claim 19, wherein the substrate support is polygonal and a plurality of the elements are positioned adjacent to one another to extend around substantially the full perimeter of the substrate support and at least one element contacts each edge of the polygonal substrate support.

32. The apparatus of claim 19, wherein the one or more elements are made of material selected from the group consisting of aluminum, titanium, stainless steel, a solid material that is coated with a conductive metallic coating, and combinations thereof.

33. The apparatus of claim 19, wherein the cross-sections of the one or more elements are about $\frac{1}{4}$ inch to about $\frac{3}{4}$ inch by about $\frac{1}{4}$ inch to about $\frac{3}{4}$ inch.

34. The apparatus of claim 19, further comprising an RF power source coupled to the gas distribution showerhead.

35. The apparatus of claim 19, wherein the one or more elements and the plurality of flexible straps are disposed between the gas distribution showerhead and the substrate support.

* * * * *

UNITED STATES PATENT AND TRADEMARK OFFICE
CERTIFICATE OF CORRECTION

PATENT NO. : 7,534,301 B2  Page 1 of 1
APPLICATION NO. : 10/946403
DATED : May 19, 2009
INVENTOR(S) : White et al.

It is certified that error appears in the above-identified patent and that said Letters Patent is hereby corrected as shown below:

Column 4, Line 27, please delete "ρis" and insert --ρ is-- therefor;

Column 4, Line 27, please delete "RE" and insert --RF-- therefor;

Column 4, Line 28, please delete "RE" and insert --RF-- therefor;

Column 4, Line 29, please delete "RE" and insert --RF-- therefor;

Column 13, Claim 15, Line 58, please insert --by about ¼ inch to about ¾ inch-- after ¾ inch.

Signed and Sealed this

Fourth Day of August, 2009

JOHN DOLL
*Acting Director of the United States Patent and Trademark Office*